United States Patent
Subramanian et al.

(10) Patent No.: US 7,295,288 B1
(45) Date of Patent: Nov. 13, 2007

(54) SYSTEMS AND METHODS OF IMPRINT LITHOGRAPHY WITH ADJUSTABLE MASK

(75) Inventors: Ramkumar Subramanian, Sunnyvale, CA (US); Bhanwar Singh, Morgan Hill, CA (US); Khoi A. Phan, San Jose, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 175 days.

(21) Appl. No.: 11/000,869

(22) Filed: Dec. 1, 2004

(51) Int. Cl.
*G03B 27/62* (2006.01)
*G03B 27/02* (2006.01)
*G03B 27/20* (2006.01)

(52) U.S. Cl. .......................... 355/75; 355/78; 101/368

(58) Field of Classification Search ................ 355/75, 355/78, 91
See application file for complete search history.

(56) References Cited

U.S. PATENT DOCUMENTS

| | | | |
|---|---|---|---|
| 6,847,433 B2* | 1/2005 | White et al. | 355/72 |
| 6,954,275 B2* | 10/2005 | Choi et al. | 356/614 |
| 7,002,665 B2* | 2/2006 | Sato et al. | 355/53 |
| 2004/0141163 A1* | 7/2004 | Bailey et al. | 355/18 |
| 2005/0189676 A1* | 9/2005 | Sreenivasan | 264/225 |
| 2005/0263077 A1* | 12/2005 | GanapathiSubramanian et al. | 118/728 |
| 2005/0264132 A1* | 12/2005 | Choi et al. | 310/311 |
| 2005/0264134 A1* | 12/2005 | GanapathiSubramanian et al. | 310/311 |

* cited by examiner

Primary Examiner—D. Rutledge
(74) Attorney, Agent, or Firm—Amin, Turocy & Calvin LLP (57) ABSTRACT

Systems and methodologies are provided that account for surface variations of a wafer by adjusting grating features of an imprint lithography mask. Such adjustment employs piezoelectric elements as part of the mask, which can change dimensions (e.g., a height change) and/or move when subjected to an electric voltage. Accordingly, by regulating the amount of electric voltage applied to the piezoelectric elements a controlled expansion for such elements can be obtained, to accommodate for topography variations of the wafer surface.

20 Claims, 9 Drawing Sheets

SYSTEMS AND METHODS OF IMPRINT LITHOGRAPHY WITH ADJUSTABLE MASK

TECHNICAL FIELD

The subject invention relates generally to imprint lithography systems, and in particular to setting and/or adjusting grating dimensions of an imprint mask, to accommodate topography variations of a wafer surface.

BACKGROUND OF THE INVENTION

In the semiconductor industry, there is a continuing trend toward higher device densities. To achieve such densities fabrication of small feature sizes and more precise feature shapes are typically required. For example, this can include fabrication of smaller width and spacing for: interconnecting lines, diameter of contact holes, and surface geometry, such as corners and edges. Accordingly, reducing the dimensions between such small features (critical dimensions—CDs) can facilitate achieving higher device densities.

At the same time, many factors can contribute to fabrication of a semiconductor. For example, at least one lithographic process can be used during fabrication of a semiconductor. This particular factor in the fabrication process is highly scrutinized by the semiconductor industry in order to improve packaging density and precision in semiconductor structure.

Typically, lithography is a process in semiconductor fabrication that relates to transfer of patterns between media. More specifically, lithography can refer to transfer of patterns onto a thin film that has been deposited onto a substrate. The transferred patterns can then act as a blueprint for desired circuit components. For example, various patterns can be transferred to a photoresist (e.g., radiation-sensitive film), which is the thin film that overlies the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permit a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Techniques, equipment and monitoring systems have concentrated on preventing and/or decreasing defect occurrence within lithography processes. For example, aspects of resist processes that are typically monitored can include: whether the correct mask has been used; whether resist film qualities are acceptable (e.g., whether resist is free from contamination, scratches, bubbles, striations, . . . ); whether image quality is adequate (e.g., good edge definition, line-width uniformity, and/or indications of bridging); whether critical dimensions are within specified tolerances; whether defect types and densities are recorded; and/or whether registration is within specified limits; etc. Such defect inspection task(s) have progressed into automated system(s) based on both automatic image processing and electrical signal processing.

Imprint lithography uses a patterned mask to "imprint" a pattern on a resist at a 1:1 feature size ratio. Imprint masks are defined at 1× (e.g., using an e-beam direct write). The 1× definition is an extremely expensive process in which errors can be costly. Moreover, critical dimension (CD) errors cannot be compensated after a lithography imprint mask has been fabricated. Thus, expensive imprint mask fabrication could result due to repeat manufacturing attempts based upon CD errors. Imprint mask integrity must typically be maintained throughout the lithography process because any flaw or structural defect present on a patterned imprint mask can be indelibly transferred to underlying layers during imprinting of a photoresist.

As such, the topography of the underlying substrate can affect the efficiency of the imprint mask and ultimately the chip performance. The topography of the underlying substrate, if not accounted for, can have a negative effect within imprint lithography based at least upon affecting the transfer into the underlying layer. The image transfer between the imprint mask and the image layer can reflect any flaw or defect based upon the long range topography. Thus, imprint mask integrity and topography considerations are crucial elements that must be considered or maintained throughout the lithography process. Current methods of pattern line formation on an imprint mask typically do not provide for a flexible approach that considers the topography variation on the wafer surface.

Therefore, there is a need to overcome the aforementioned deficiencies associated with conventional systems

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the subject invention. Rather, the sole purpose of this summary is to present some concepts of the invention in a simplified form as a prelude to the more detailed description that is presented hereinafter.

The subject invention provides for systems and methods of adjusting grating features of an imprint lithography mask by employing expandable piezoelectric elements as part of the mask. Such piezoelectric elements can change dimensions (e.g., a height change) and/or move along an axis when subjected to an electric voltage. Accordingly, by regulating the amount of electric voltage applied to the piezoelectric elements a controlled expansion for such elements can be obtained. The piezoelectric elements can consist of thin slabs or plates of quartz transducers that are cut in a precise orientation to the crystal axes depending on the desired axis of expansion. Such expansion, for example if in the vertical direction, can in turn be employed to account for topography variations on the wafer surface, in order to imprint desired features to preferred depths. The customization of grating features according to the subject invention can increase flexibility in circuit fabrication, while at the same time mitigating (or eliminating) undesired imprint variability due to topographic features on the wafer surface.

According to an aspect of the invention, a control system can regulate electric field being applied to various parts of a piezoelectric grating as part of the mask. Such control component can further include a monitoring component (e.g., a scatterometry system) to detect the presence of a topography variation on the wafer surface. If topography variation is detected, the control component can for example selectively decrease/increase height for piezoelectric elements on the mask gratings, in order to compensate for the topography variation.

In a related aspect of the subject invention based on real time information received from the monitoring component, a control loop can be created, wherein the control component can make determinations regarding whether topography variations are present, whether extant topography variations can hinder creation of selected imprint patterns on a wafer, whether compensatory action was successful in mitigating detected topography variation and the like.

Moreover, inferences can be made regarding, for example, whether to initiate compensatory action to correct detected topography variation. Such inferences can be based on, for example, information related to the severity of the topography variation, the number of topography variations detected, the location of detected topography variation, and the like. For example, a topography variation that is detected in a non-critical area can be ignored, thus saving costs and time associated with compensating for the topography variation. Such can permit increased efficiency and economic benefit by augmenting the criteria germane to making a decision regarding compensating for potentially destructive topography variations. In addition, various artificial intelligence components can be employed as part of the feedback-driven, closed loop system to facilitate inferences required for obtaining desired grating features.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not be drawn to scale from one figure to another or within a given figure.

DETAILED DESCRIPTION OF THE INVENTION

The subject invention is now described with reference to the drawings, wherein like reference numerals are used to refer to like elements throughout. In the following description, for purposes of explanation, numerous specific details are set forth in order to provide a thorough understanding of the subject invention. It may be evident, however, that the subject invention may be practiced without these specific details. In other instances, well-known structures and devices are shown in block diagram form in order to facilitate describing the subject invention.

Figure 1:
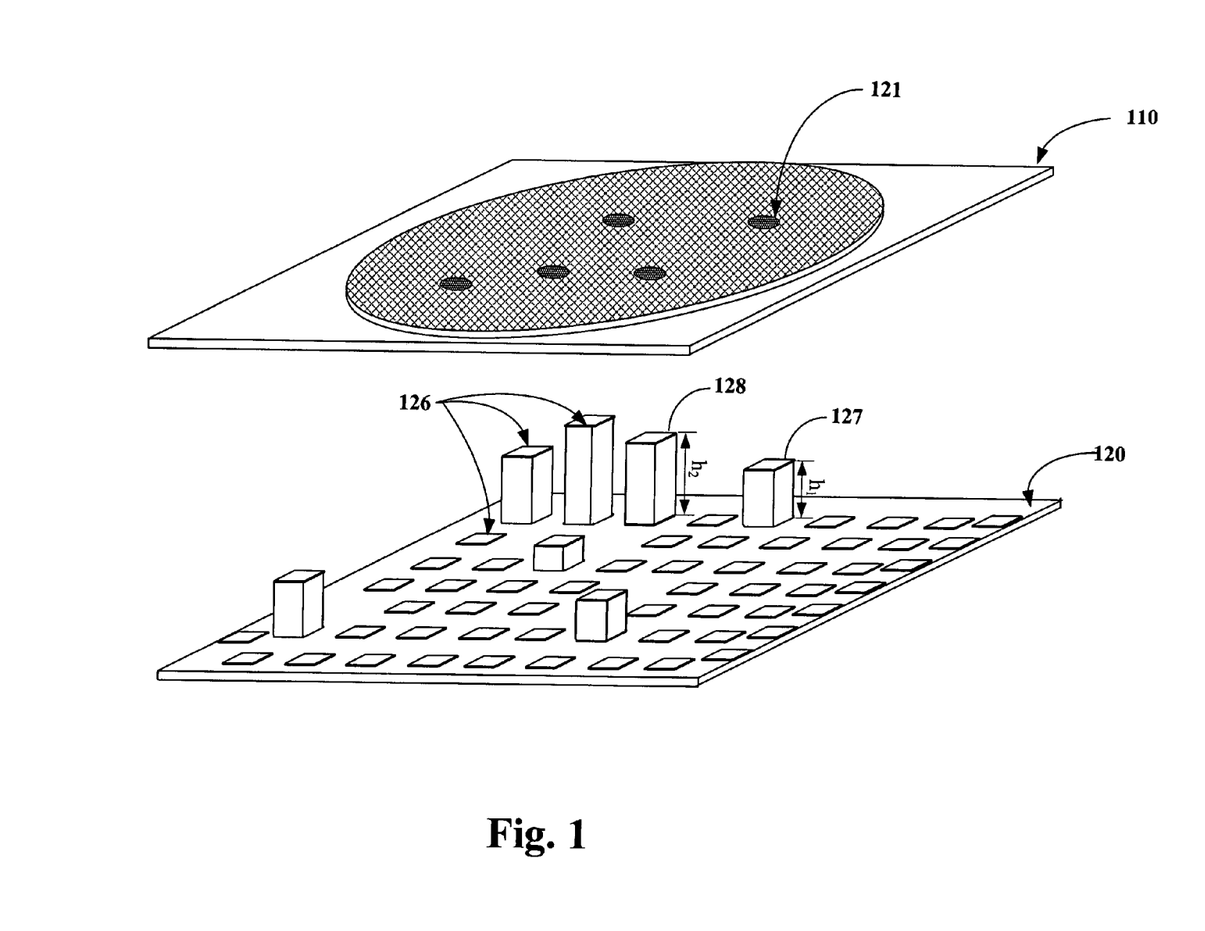
FIG. 1 illustrates a perspective layout of an imprint mask assembly having a grating with piezoelectric elements that are adjustable relative to topographic variations on a wafer surface according to one aspect of the subject invention.

Referring initially to FIG. 1 a perspective assembly layout of wafer surface 110 with varying topography undergoing a transfer of patterns from a mask 120 is illustrated. The wafer surface 110 can include topography variations as localized spots (e.g., height variations) 121 throughout the wafer surface. In accordance with an aspect of the subject invention, the mask 120 can include a plurality of piezoelectric elements 126, for example in the shape of thin slabs or plates that are cut in a precise orientation to the crystal axes depending on the desired axis of expansion. The piezoelectric elements 126 can change dimensions, for example expand in a desired longitudinal axis when subject to a suitable voltage. As such, piezoelectric member(s) 127 can be subject to a selected voltage so that its height expands to a level of $h_1$. Similarly, piezoelectric member 128 can be subject to another voltage such that its height increases to a level of $h_2$. Typically, a desired height or expansion at a desired axis can be achieved by a selection of a suitable voltage. Such controlled expansion to a predetermined height for a piezoelectric member(s) 126 on the mask 120, to correspond to the typographic contour variation on the wafer surface. Accordingly, variable heights can be set for the piezoelectric members located on the mask 120, to facilitate an imprint of desired features on the wafer 110. Moreover, such customization of grating features according to the subject invention can increase flexibility in circuit fabrication, while at the same time mitigating (or eliminating) undesired imprint variability due to topographic features on the wafer surface. The piezoelectric members can be fabricated from any piezoelectric material that can grow in response to an electric field. Such material can for example include a variety of ceramics with a perovskite structure quartz, barium titanate, lead niobate, lead zirconate titanate, and the like.

Figure 2:
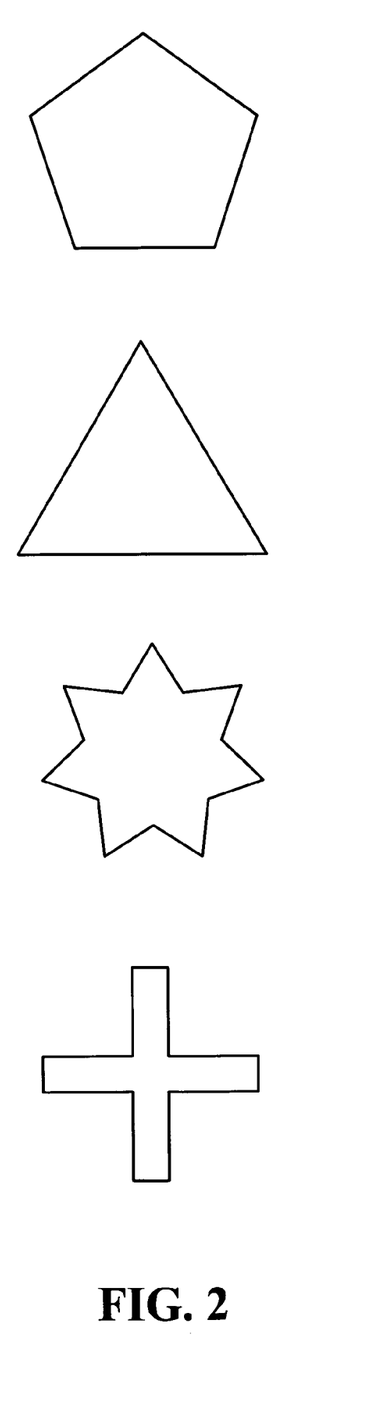
FIG. 2 illustrates a plurality of exemplary cross section configurations for the piezoelectric elements of the subject invention.

It is to be appreciated that other geometric configurations and across sections as illustrated in FIG. 2 can also be employed in addition to the slab shaped component described above, and are well within the realm of the subject invention. Moreover, various electronic circuitry and components can be embedded into a spreading assembly of the piezoelectric component in a variety of planar or three dimensional arrangements to gather, monitor, regulate and over all manage expansion away from and/or into the wafer surface, to imprint the desired lithographic features.

Figure 3:
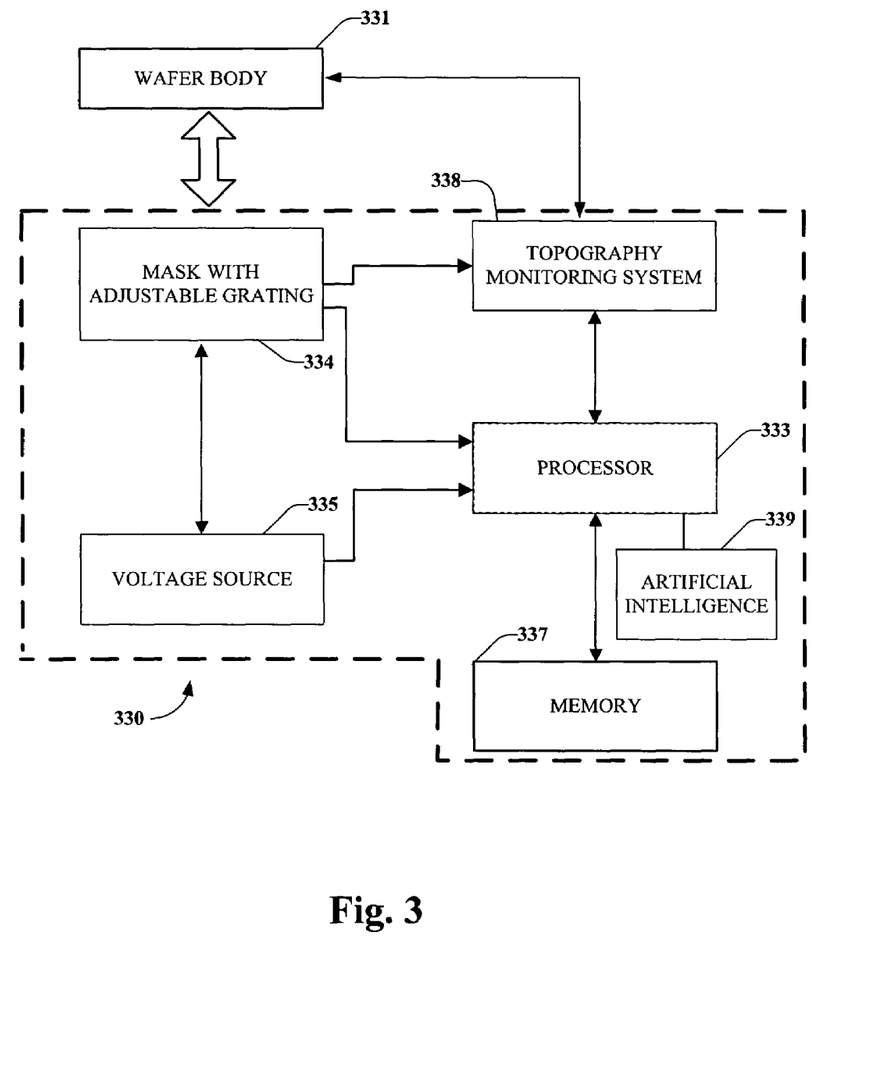
FIG. 3 is a block diagram of a system that controls the expansion of piezoelectric elements in accordance with an aspect of the subject invention.

Referring now to FIG. 3, a schematic block diagram of a controlled imprint lithography system 330 according to one aspect of the invention is illustrated. The system 330 includes a mask 334 with adjustable grating, which further includes piezoelectric network assembly that interacts with the wafer 331. The piezoelectric net work assembly can consist of a plurality of piezoelectric components, (as that described in detail infra), which can change dimension in response to an applied voltage, such as from the source 335. Accordingly, each piezoelectric component can interact with a respective portion of the wafer surface. A processor 333 can be operatively coupled to the piezoelectric network assembly of the mask 334, and be programmed to control and operate the expansion of the various piezoelectric components. At the same time, a topography monitoring system 338 can be operatively connected to the processor 333 and the wafer 331. The topography monitoring system 338 operates to monitor surface topography and height adjustments for the wafer 331. The collected topography data can then be supplied to the processor 333, which employs these data in controlling the expansion of piezoelectric components on the mask 334 to obtain desired grating features on the wafer 331. The processor 333 can be part of an intelligent device that has the ability to sense or display information, or convert analog information into digital, or perform mathematical manipulation of digital data, or interpret the result of mathematical manipulation, or make decisions on the basis of the information. As such, the processor can be part of a logic unit, a computer or any other intelligent device capable of making decisions based on the data gathered by the monitoring system 338. A memory 337 can be coupled to the processor 330 to store program code executed by the processor 333 for carrying out operating functions of the system 330 as described herein. The memory 337 can include read only memory (ROM) and random access memory (RAM). The ROM contains among other code the Basic Input-Output System (BIOS) which controls the basic hardware operations of the system 330. The RAM is the main memory into which the operating system and application programs are loaded. The memory 337 also serves as a storage medium for storing information such as topography heights, desired pattern tables, expansion/retraction rates of the piezoelectric components, and other data employed in carrying out the subject invention. For mass data storage, the memory 337 can include a hard disk drive (e.g., 10 Gigabyte hard drive), and the like.

In addition various artificial intelligence component(s) 339 can be employed in conjunction with inferring the amount of expansion/voltage required for shaping the desired imprint on the wafer surface. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

The subject invention (e.g., in connection with choosing region(s) on the wafer surface for interaction with the piezoelectric member and/or imprinting desired features) can employ various artificial intelligence based schemes for carrying out various aspects thereof. For example, a process for determining which region to be selected and/or level of expansion for the piezoelectric components can be facilitated via an automatic classification system and process. Such classification can employ a probabilistic and/or statistical-based analysis (e.g., factoring into the analysis utilities and costs) to prognose or infer an action that is desired to be automatically performed. For example, a support vector machine (SVM) classifier can be employed. A classifier is a function that maps an input attribute vector, $x=(x1, x2, x3, x4, xn)$, to a confidence that the input belongs to a class—that is, $f(x)=confidence(class)$. Other classification approaches include Bayesian networks, decision trees, and probabilistic classification models providing different patterns of independence can be employed. Classification as used herein also is inclusive of statistical regression that is utilized to develop models of priority. As will be readily appreciated from the subject specification, the subject invention can employ classifiers that are explicitly trained (e.g., via a generic training data) as well as implicitly trained (e.g., via observing system behavior, receiving extrinsic information) so that the classifier(s) is used to automatically determine according to a selected criteria which regions to choose. For example, with respect to SVM's it is to be appreciated that other classifier models may also be utilized such as Naive Bayes, Bayes Net, decision tree and other learning models—SVM's are configured via a learning or training phase within a classifier constructor and feature selection module.

Figure 4:
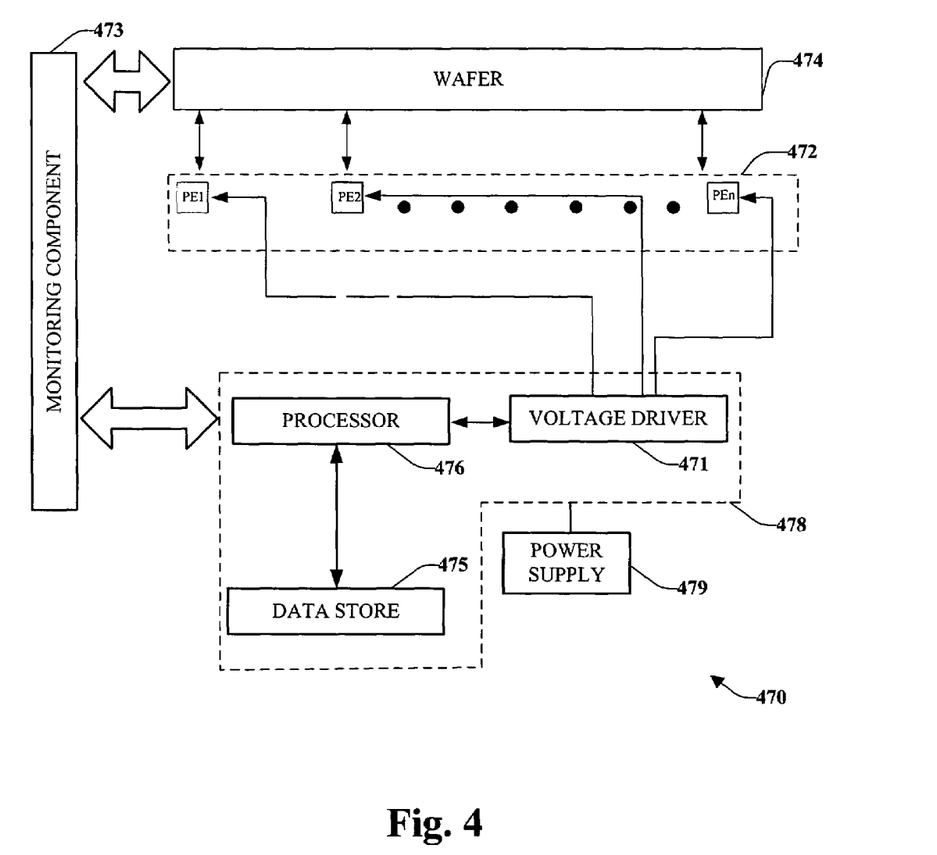
FIG. 4 illustrates another exemplary control system according to a particular aspect of the subject invention.

FIG. 4 illustrates a detailed schematic diagram illustrating such a system for controlling the expansion of piezoelectric components to obtain desired lithographic features on surface of wafer 474. The system 470 includes a plurality of piezoelectric components (PE1, PE2 . . . PE[n]), wherein "n" is an integer. In one aspect, the piezoelectric components PE are preferably distributed along the surface of the mask 472 so as to uniformly cover its surface. Each piezoelectric component can perform a desired imprint on a respective portion of the wafer surface 474. In addition, each piezoelectric component and the associated circuitry can be connected to the voltage driver for a controlled expansion to create desired imprints features on the wafer surface 474. Based on the information received from the monitoring components 473 as well as other information (e.g., anticipated location of the varied topography, properties of the wafer), the processor 476 drives the voltage driver 479 operatively coupled thereto to control the expansion of the piezoelectric components in a desired manner to imprint desired features on the wafer surface via the adjustable mask grating. The processor 476 can control the expansion of the piezoelectric components of the adjustable grating mask 472.

By way of example, the processor 476 can be programmed to compare (e.g., by pattern matching, interpolation or otherwise) one or more measured values by the monitoring component 473 to one or more stored values. The stored values can be maintained in the data store 475 and may include, for example, acceptable and unacceptable levels of non-uniformity, expansion for piezoelectric components, critical dimension tolerances, and the like. By way of further example, the processor 476 can determine whether the surface of wafer 474 has heights above a certain threshold level and/or whether the surface topography of such wafer vary in height by more than a particular percentage, such that the structure dimensions are not coincident with that of optimal circuit layouts.

If a measured level of structural non-uniformity falls within a pre-defined acceptable range, then the processor 476 can, for example, expand the piezoelectric components on the adjustable mask grating 472 and direct the wafer 474 to additional/further processing. If, however, the level of non-uniformity, for example, exceeds a pre-defined range, then the processor 476 can direct the wafer 474 (or portions thereof) to be discarded, since the sheer amount of non-uniformity among repeating in circuit structures has rendered the wafer or portions thereof unsalvageable. The determination to discard the wafer can be based upon, for example, a programmed cost-benefit analysis, Bayesian system neural network, rule based expert system, and the like. For example, if the cost of repairing or reducing the non-uniformity outweighs the benefit received from such repair, then it could be determined that it would be more cost and time effective to simply discard the wafer 474, or portions thereof.

Additionally, the processor 476 can selectively mark the wafer 474 or portions thereof for correction and determine what type of adjustments are to be made to particular fabrication components to effect the same. The processor 476 transmits these adjustments to the appropriate fabrication components (not shown) for the purpose of, for example, mitigating occurrences of non-uniform structure formation, or other undesirable processing, such as, critical dimensions falling outside of acceptable tolerances and/or the occurrence of overlay.

The processor 476 can, for example, be programmed to utilize non-linear training systems to determine the appropriate adjustments to make according to the information received from the monitoring component 473. This can be referred to as feedback/feed forward control data that facilitates achieving desired results. By way of example, based on non-uniformity of wafer topography (e.g., having varying heights), the processor 476 can designate or mark certain piezoelectric components to undergo additional expansion, as compared to other piezoelectric components, for particular durations in order to mitigate discarding the wafer.

It will be appreciated that the processor 476 can also be programmed to cause the monitoring system to focus in on/take additional readings at portions of the wafer 474 where it is determined that substantial changes in the wafer topography are detected (e.g., in uniformity or otherwise).

The microprocessor 476 can be part of a control unit 478 that has the ability to sense or display information, or convert analog information into digital, or perform mathematical manipulation of digital data, or interpret the result of mathematical manipulation, or make decisions on the basis of the information. As such, the control unit can be logic unit, a computer or any other intelligent device capable of making decisions based on the data gathered and provided to it by the monitoring component 473. The control unit 478 designates which piezoelectric component should be expanding, and/or which piezoelectric component should be retracting, and which one of the piezoelectric components should remain inactive, when interacting with the wafer surface. The monitoring component 473 can provides the control unit 478 with data gathered continuously about various physical properties of the different regions of the wafer surface, such as, topography, contours, erosion rate, and the like. In addition, a suitable power supply 479 provides operating power to the control unit 478.

Based on the data provided, the control unit 478 makes a decision about the operation of the various portions of the piezoelectric structure assembly, e.g. deciding what number of the piezoelectric component should become active to form desired features across the wafer surface. Accordingly, the control unit 478 controls the expansion/contraction rates of the piezoelectric structure of the mask 472, which in turn forms the grating features on the wafer surface 474.

Figure 5:
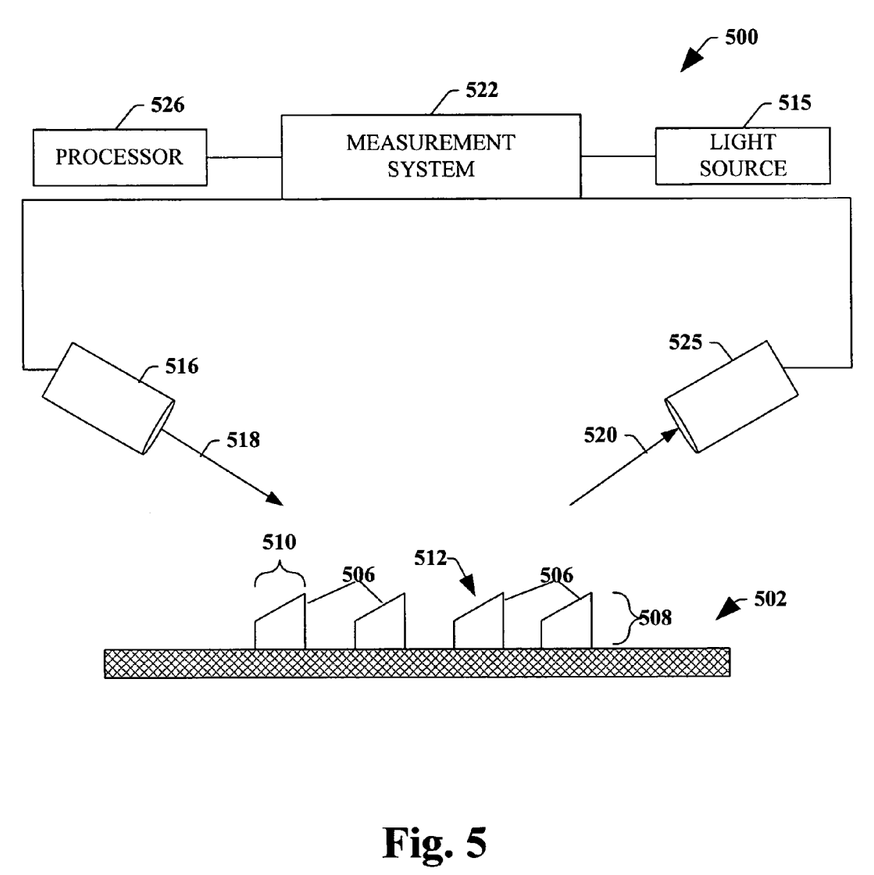
FIG. 5 illustrates a monitoring component in the form of a scatterometry device in accordance with an aspect of the present invention.

In accordance with one or more aspects of the present invention, the monitoring component 473 can be, for example, a scatterometry component, as illustrated in FIG. 5. Referring now to FIG. 5, scatterometry based techniques can be employed to measure one or more dimensions of the wafer surface topography structures 506 at various points in to determine the expansion of various piezoelectric components of the wafer surface. Different structure heights 508, widths 510 and/or slopes 512 can, for example, be measured to generate different signatures that may be indicative of the effect that one or more processing components, such as expansion of the piezoelectric components of the mask grating (not shown), which are operating within particular parameters are having on the fabrication process. The measurements/signatures can be analyzed to generate feedback/feed forward information that can be utilized to adjust operating parameters of processing components to which the same or other die are/will be subjected to mitigate undesired results. For example, respective structure heights can be measured periodically to determine if the desired features are being imprinted as desired. If not, one or more fabrication components and operating parameters associated therewith can be adapted accordingly based upon feedback/feed forward control data derived from the measurements. For instance, the level of expansion for various piezoelectric components on the wafer grating can be adjusted to obtain desired imprint results. In the system 500, a light source 515 provides light to one or more light emitters 516 that direct a light 518 incident to the wafer topography 506 formed on the wafer 502 as the fabrication process progresses. Preferably, the light source 515 is a frequency stabilized laser, however, it will be appreciated that any laser or other light source (e.g., laser diode or helium neon (HeNe) gas laser) suitable for carrying out the subject invention can be employed. The light 518 is reflected from the wafer surface topography structures 508 as reflected light 520. The incident light 518 can be referred to as the reference beam, and thus the phase, intensity and/or polarization of the reference beam 518 can be recorded in a measurement system 522 to facilitate later comparisons to the reflected beam 520 (e.g., via signature comparison). As the imprint process progresses the angle of the reflected light 520 from the structures 506 will vary in accordance with the evolving dimensions of the structures 506. Similarly, the intensity, phase and polarization properties of the spectrally reflected light 520 can vary in accordance with the evolving dimensions. One or more light detecting components 525 collects the reflected light 520 and transmits the collected light, and/or data associated with the collected light, to the measurement system 522. Any one or more light detecting components 525 suitable for carrying out aspects of the present invention may be employed (e.g., photo detector, photo diodes) for collecting reflected light 520. The measurement system 522 forwards information from the detecting components to a processor 526, which can also be integral with the measurement system 522. The processor, or central processing unit (CPU), is programmed to control and carry out the various functions described herein. The processor 526 can be any of a plurality of processors, and the manner in which the processor can be programmed to carry out the functions described herein will be readily apparent to those having ordinary skill in the art based on the description provided herein. The reflected light 520 can, for example, be analyzed to generate one or more signatures that can be compared to one or more signatures stored in a signature store (e.g., a memory) to determine whether, for example, desired imprint features are being achieved and/or whether the piezoelectric components are adjusted properly based on the topography of the wafer surface, and thus whether, for example, feed forward and/or backward information should be generated and applied to selectively control and adjust one or more operating parameters to adapt the fabrication process to achieve a desired result. It will be appreciated that a multitude of structures can be formed on the wafer 502 and/or die in the wafer during the fabrication process to produce any number of circuits and/or circuitry components. Accordingly, the system 500 can be configured and operated (e.g., via the processor) to seek out and obtain measurements from topography changes forming within the wafer (e.g., to facilitate determining uniformity and consistency of processing and structure formation via the regulated expansion of the piezoelectric members).

Figure 6:
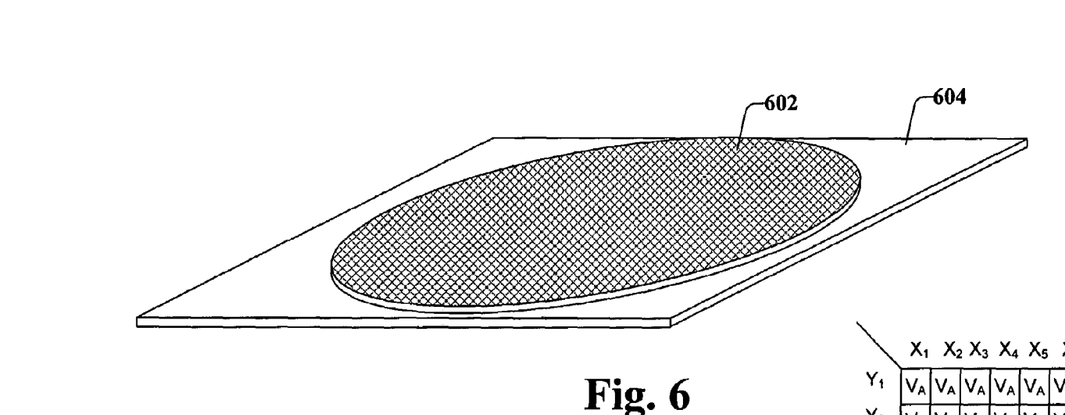
FIG. 6 illustrates a perspective view of a grid-mapped wafer according to one or more aspects of the present invention.
Figure 7:
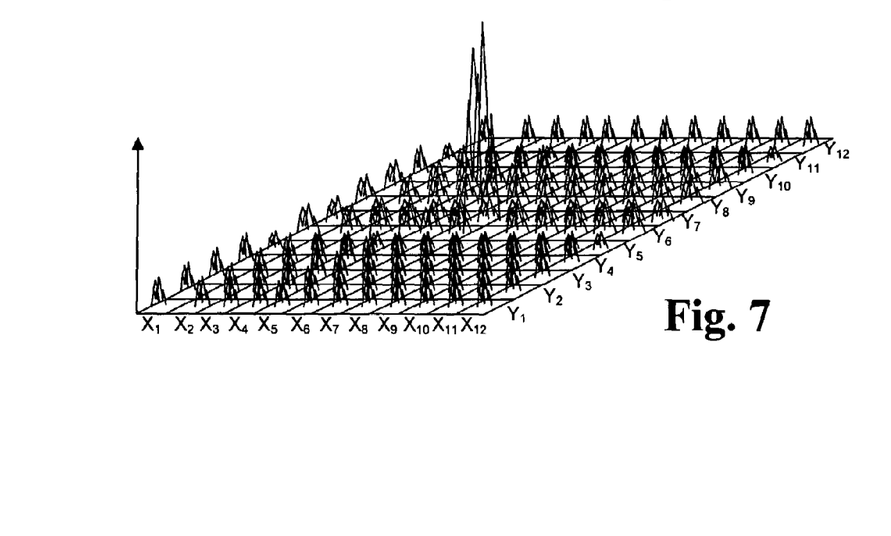
FIG. 7 illustrates plots of measurements taken at grid-mapped locations on a wafer in accordance with one or more aspects of the present invention.
Figure 8:
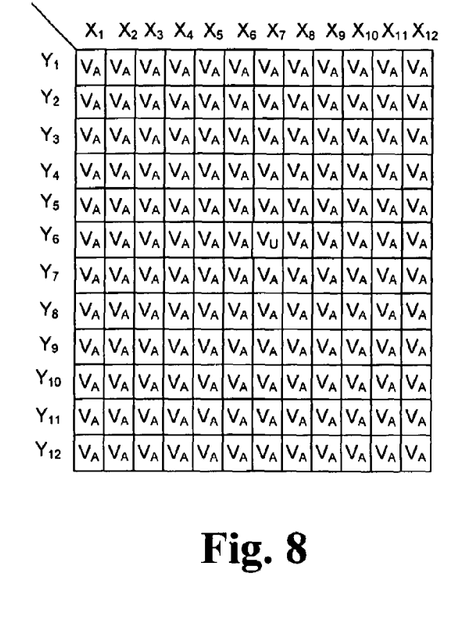
FIG. 8 illustrates a table containing entries corresponding to measurements taken at respective grid-mapped locations on a wafer in accordance with one or more aspects of the present invention.

Turning now to FIGS. 6-8, in accordance with one or more aspects of the subject invention, a wafer 602 situated on a stage 604 can be logically partitioned into grid blocks to facilitate measurement of topography contours as the wafer undergoes the imprint lithography in accordance with an aspect of the subject invention. This can facilitate selectively determining to what extent, if any, fabrication adjustments, such as expansion/retraction of piezoelectric components can become necessary. Obtaining such information can also assist in determining problem areas associated with fabrication processes.

FIG. 6 illustrates a perspective view of a steppable stage 604 supporting a wafer 602. The wafer 602 can be divided into a grid pattern as shown in FIG. 7. Each grid block (XY) of the grid pattern corresponds to a particular portion of the wafer 602 (e.g., a die or a portion of a die). The grid blocks are individually monitored for fabrication progress by measuring topography features with scatterometry based techniques.

In FIG. 7, surface topography on one or more respective portions of a wafer 602 ($X_1Y_1 \ldots X_{12}, Y_{12}$) are monitored with scatterometry based techniques. Exemplary measurements produced during fabrication for each grid block are illustrated as respective plots. The plots can, for example, be composite valuations of signatures of critical dimensions and/or overlay of the measured structures, as well as indications of imprint lithography formations on the wafer surface. As can be seen, the measurement at coordinate $X_7Y_6$ yields a plot that is substantially higher than the respective measurements of the other portions XY. This can be indicative of non-uniformity, a height and/or topography outside of acceptable tolerances. As such, fabrication components and/or operating parameters associated therewith can be adjusted (e.g., piezoelectric component height adjustment on mask) accordingly to mitigate this aberrational measurement. It is to be appreciated that the wafer 602 and or one or more die located thereon may be mapped into any suitable number and/or arrangement of grid blocks to effect desired monitoring and control.

FIG. 8 is a representative table of surface contours taken at various portions of the wafer 602 mapped to respective grid blocks. The measurements in the table can, for example, be amalgams of structure uniformity, critical dimension and overlay signatures. As can be seen, all the grid blocks, except grid block $X_7Y_6$, have measurement values corresponding to an acceptable value ($V_A$), while grid block $X_7Y_6$ has an undesired value ($V_U$). Thus, it has been determined that an undesirable fabrication condition exists at the portion of the wafer 602 mapped by grid block $X_7Y_6$. Accordingly, fabrication process components and parameters may be adjusted as described herein to adapt the fabrication process accordingly to mitigate the re-occurrence or persistence of this unacceptable condition. Alternatively, a sufficient number of grid blocks may have desirable measurements so that the single offensive grid block does not warrant scrapping the entire wafer. It is to be appreciated that fabrication process parameters may be adapted so as to maintain, increase, decrease and/or qualitatively change the fabrication of the respective portions of the wafer 702 as desired. For example, when the fabrication process has reached a pre-determined threshold level (e.g., X % of grid blocks have acceptable imprint lithography uniformity), a fabrication step can be terminated.

Figure 9:
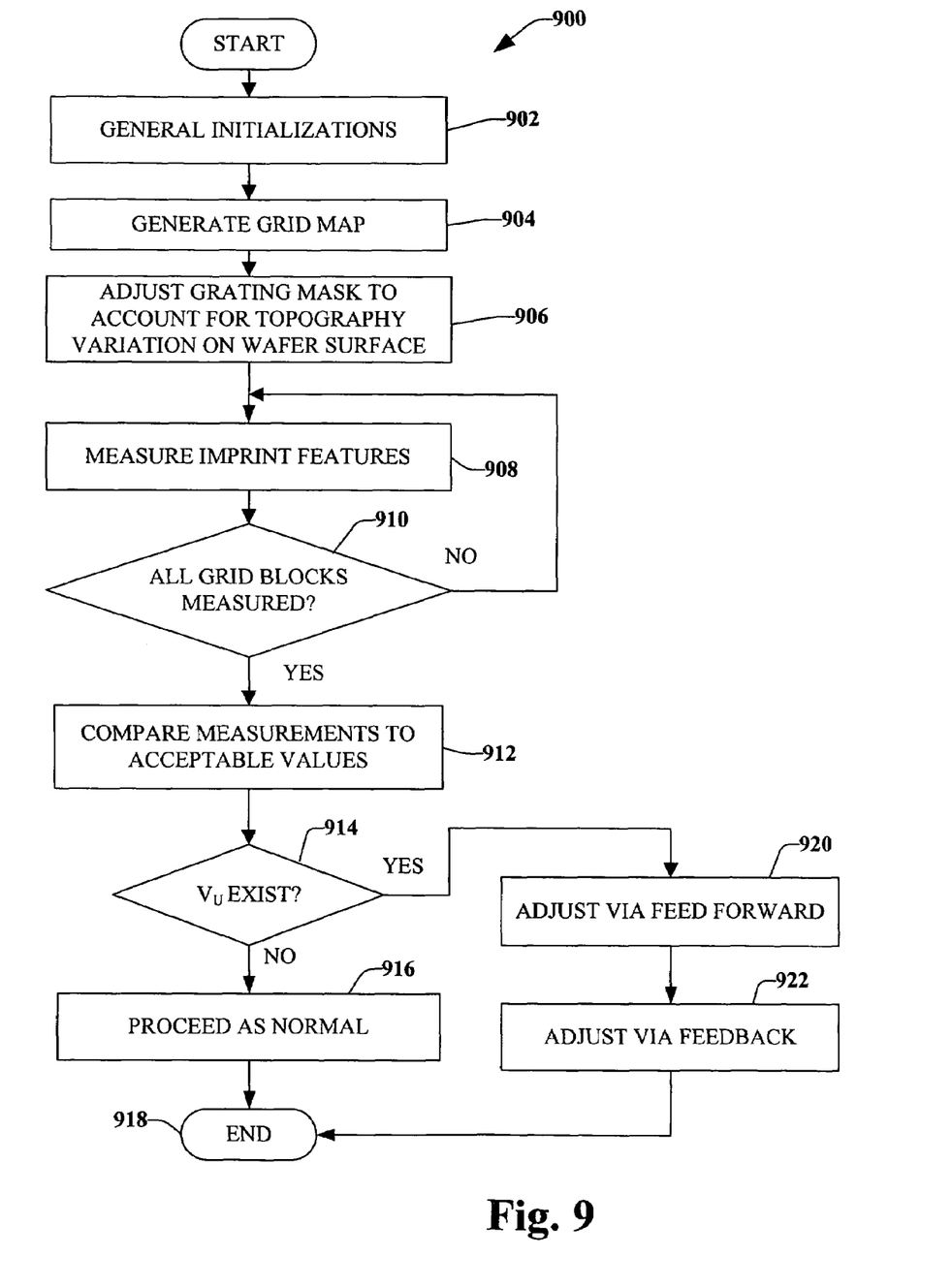
FIG. 9 is flow diagram illustrating a methodology in accordance with an aspect of the present invention.

In view of the exemplary systems shown and described above, a methodology, which can be implemented in accordance with one or more aspects of the present invention, will be better appreciated with reference to the flow diagram of FIG. 9. While, for purposes of simplicity of explanation, the methodology is shown and described as a series of function blocks, it is to be understood and appreciated that the subject invention is not limited by the order of the blocks, as some blocks may, in accordance with the present invention, occur in different orders and/or concurrently with other blocks from that shown and described herein. Moreover, not all illustrated blocks may be required to implement a methodology in accordance with one or more aspects of the present invention. It is to be appreciated that the various blocks may be implemented via software, hardware a combination thereof or any other suitable means (e.g., device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

FIG. 9 is flow diagram illustrating a methodology 900 for monitoring and controlling an imprint lithography process on a wafer surface according to one or more aspects of the present invention. The methodology begins at 902 wherein general initializations are performed. Such initializations can include, but are not limited to, establishing pointers, allocating memory, setting variables, establishing communication channels and/or instantiating one or more objects. At 904, a grid map including one or more grid blocks "XY" is generated. Such grid blocks may correspond to die on the wafer and or to portions of one or more die on a wafer, for example.

At 906, piezoelectric components on the mask are adjusted to account for the typographic features of the wafer. At 908, as the wafer matriculates through the imprint lithography process fabrication, formed imprint features are measured with scatterometry based techniques at the grid mapped locations. For example, structure heights, widths, slopes, and the like, can be measured. At 910, a determination is made as to whether measurements have been taken at all (or a sufficient number) of grid mapped locations. If the determination at 910 is NO, then processing returns to 908 so that additional measurements can be made. If the determination at 910 is YES, then at 912 the measurements are compared to acceptable values to determine if the fabrication process is progressing as planned. By way of example, the measurements can be compared to acceptable values to determine if the imprint features are being formed uniformly, if critical dimensions are being maintained within acceptable tolerances, and the like. Additionally, or in the alternative, the measurements can be analyzed to produce respective signatures to serve as the basis for such determinations. These signatures can be compared to acceptable signature values for respective grid mapped locations. At 914, a determination is made as to whether an undesired value ($V_U$) has been encountered at any one or more of the grid mapped locations (e.g., indicating that proper imprint features are not being formed uniformly, and/or that one or more critical dimensions are outside of acceptable tolerances). If the determination at 914 is NO, then at 916 processing continues as normal. The methodology can thereafter advance to 918 and end. If, however, the determination at 914 is YES, meaning that an undesired value was encountered, then at 920, one or more fabrications components and/or operating parameters (e.g., a piezoelectric expansion of the imprint mask) associated therewith can be selectively adjusted as described herein according to feed forward control data derived from the measurements to mitigate or remedy the situation. For example, data generated by sophisticated modeling techniques can be fed forward to imprint stages to control processing parameters such as bake time and/or temperature. At 922, control data derived from the measurements can also be feed back to adjust one or more fabrications components and/or operating parameters associated therewith to mitigate re-occurrence of the undesired event during subsequent processing. For instance, the grating on the imprint lithography mask can be adjusted to facilitate obtaining proper formation of desired features. Similarly, exposure time and/or intensity can be controlled so that proper imprints are formed on the wafer surface. The methodology then ends at 918. As mentioned above, events can occur in orders different from that depicted in FIG. 9.

Figure 10:
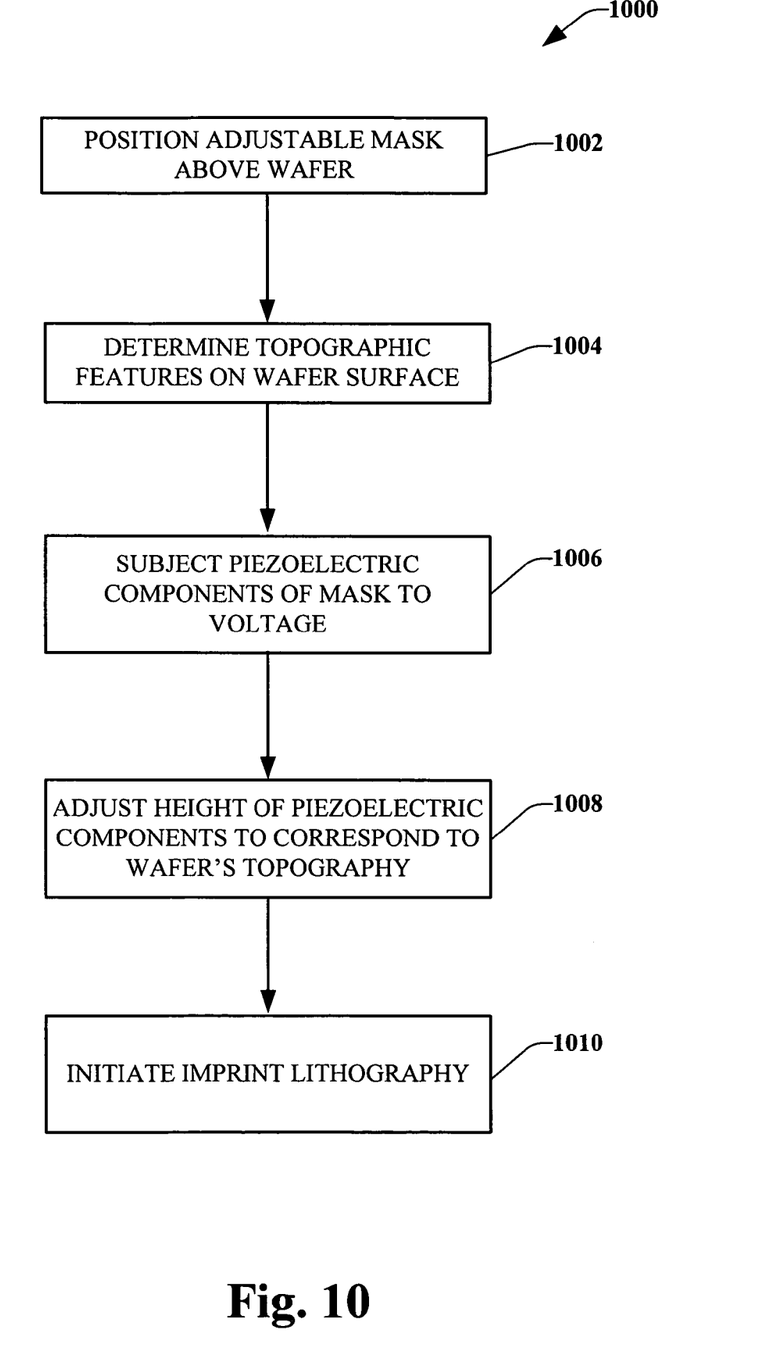
FIG. 10 illustrates a flow chart for adjusting a size of piezoelectric components in accordance with an exemplary aspect of the subject invention.

FIG. 10 illustrates a flow chart 1000 in accordance with an exemplary aspect of the subject invention. Initially and at 1002, a mask with piezoelectric components can be placed above a wafer surface that is subject to an imprint lithography process. Typically in such processes, the topography of the wafer surface can affect the efficiency of the imprint mask and ultimately the chip performance. At 1004, the topographic features on the wafer surface can be determined, for example via a scatterometry system as described in detail infra. Next, and at 1006 piezoelectric components on the mask surface are subject to a voltage, and their heights are adjusted to correspond to the wafer' topography at 1008. As such, the topography of the wafer surface can be accounted for to mitigate a negative effect within imprint lithography, such as adversely affecting pattern transfer into the underlying layer due to height variations on the wafer surface. The imprint lithography process can then proceed as depicted at 1010.

Figure 11:
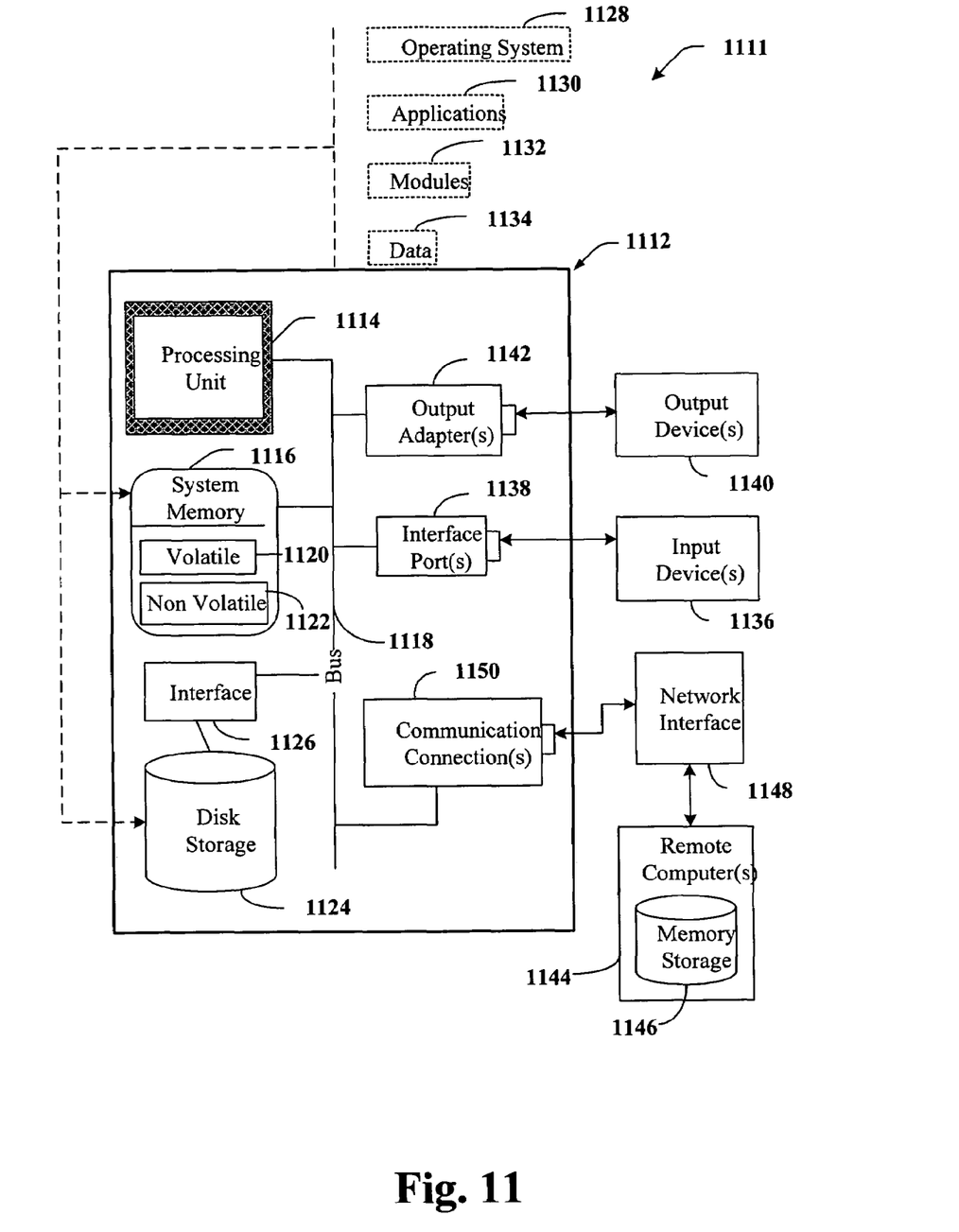
FIG. 11 illustrates an exemplary computer environment for implementing various aspects of the subject invention.

With reference to FIG. 11, an exemplary environment 1111 for implementing various aspects of control/monitoring of the invention is illustrated that includes a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus using any variety of available bus architectures including, but not limited to, an 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1116 can include volatile memory 1120 and nonvolatile memory 1122. The basic input/output system (BIOS), containing the basic routines to transfer information between elements within the computer 1112, such as during start-up, is stored in nonvolatile memory 1122. By way of illustration, nonvolatile memory 1122 can include read only memory (ROM), programmable ROM (PROM), electrically programmable ROM (EPROM), electrically erasable ROM (EEPROM), or flash memory. Volatile memory 1120 can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1112 also includes removable/nonremovable, volatile/nonvolatile computer storage media. FIG. 11 illustrates, for example a disk storage 1124. Disk storage 1124 includes, but is not limited to, devices like a magnetic disk drive, floppy disk drive, tape drive, Jaz drive, Zip drive, LS-110 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used such as interface 1126.

It is to be appreciated that FIG. 11 describes software that acts as an intermediary between users and the basic computer resources described in suitable operating environment 1111. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the present invention can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port may be used to provide input to computer 1112, and to output information from computer 1112 to an output device 1140. Output adapter 1142 is provided to illustrate that there are some output devices 1140 like monitors, speakers, and printers among other output devices 1140 that require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 can be logically connected to computer 1112 through a network interface 1148 and then physically connected via communication connection 1150. Network interface 1148 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

What is claimed is:

1. A system for facilitating imprint lithography comprising:
   a mask with a plurality of piezoelectric components adjustable to reach defined dimensions to mitigate topography variations on a wafer surface during an imprint lithography operation, and
   a source that supplies a voltage to the piezoelectric components.

2. The system of claim 1, wherein the piezoelectric components are spread over a surface of the mask.

3. The system of claim 1, wherein the piezoelectric components comprise a material selected from a group consisting of barium titanate, lead niobate, and lead zirconate titanate.

4. A system that facilitates imprint lithography on a wafer surface comprising:
   an adjustable imprint lithography mask including piezoelectric components with changeable dimensions to obtain desired imprint features on the wafer surface; and
   a control component that changes a dimension of the piezoelectric components based on a topography variation on the wafer surface.

5. The system of claim 4, further comprising a monitoring component operatively connected with the mask to monitor imprint features formed by the mask on the wafer surface.

6. The system of claim 5, wherein the monitoring component further comprises a scatterometry component that monitors formation of the imprint features.

7. The system of claim 5, wherein the control component includes a processor that analyzes topography data related to the wafer surface.

8. The system of claim 7, wherein the control component further comprises an artificial intelligence component that infers a size adjustment for the piezoelectric components.

9. The system of claim 7, wherein the control component is in communication with the monitoring component.

10. The system of claim 7, wherein the processor determines the existence of an unacceptable topography features for a region on the wafer surface.

11. The system of claim 7, further comprising a control loop for size adjustment of the piezoelectric components, the control loop operates based on real-time information.

12. The system of claim 7 further comprising a voltage driver operatively connected to the piezoelectric components.

13. The system of claim 7 further comprising a signature store that stores signatures for a comparison thereof with measured values.

14. A method of imprinting a lithographic feature on a wafer surface comprising:
   adjusting grating heights on a mask via supplying a voltage to piezoelectric components of the mask during an imprint lithography operation; and
   reducing height variations on the wafer surface via the piezoelectric components.

15. The method of claim 14 further comprising regulating grating heights via a control component.

16. The method of claim 14 further comprising creating a topography grid of the wafer surface.

17. The method of claim 15 the regulating act further comprising monitoring formation of imprint lithographic features on the wafer surface.

18. The method of claim 14 further comprising comparing a height of a region on the wafer surface with an allowable height for that region.

19. The method of claim 14 further comprising forming a control loop in real time to form the lithographic feature.

20. A system for imprinting a lithographic feature on a wafer surface comprising:
   adjusting means for adjusting topography variations on the wafer surface; and
   means for controlling the adjusting means.

* * * * *